United States Patent [19]

Coon et al.

[11] Patent Number: 4,891,522

[45] Date of Patent: Jan. 2, 1990

[54] MODULAR MULTI-ELEMENT HIGH ENERGY PARTICLE DETECTOR

[75] Inventors: Darryl D. Coon; John P. Elliott, both of Pittsburgh, Pa.

[73] Assignee: Microtronics Associates, Inc., Pittsburgh, Pa.

[21] Appl. No.: 255,729

[22] Filed: Oct. 11, 1988

[51] Int. Cl.$^4$ .............................................. G01T 1/24
[52] U.S. Cl. ........................... 250/370.10; 250/370.14; 250/394
[58] Field of Search ...................... 250/370.14, 370.10, 250/370.08, 370.09, 336.1, 394, 332

[56] References Cited

U.S. PATENT DOCUMENTS

| | | | |
|---|---|---|---|
| 3,843,886 | 10/1974 | Stumpel et al. | 250/336.1 |
| 3,949,210 | 4/1976 | Eichinger et al. | 250/336.1 |
| 4,070,578 | 1/1978 | Timothy et al. | 250/336.1 |
| 4,259,575 | 3/1931 | LeVert et al. | 250/336.1 |
| 4,659,931 | 4/1987 | Schmitz et al. | 250/370.08 |

OTHER PUBLICATIONS

A. Nakamoto et al., A Si(Li)–Pb Shower Calorimeter For p–p Collider Experiments, Nuclear Instruments and Methods in Physics Research A238 (1985) 53–60.
A. Nakamoto et al., A 4–Inch Silicon/Tungsten Calorimeter for p–p Collider Experiments, Nuclear Instruments and Methods in Physics Research A251 (1986) 275–285.

*Primary Examiner*—Carolyn E. Fields
*Attorney, Agent, or Firm*—Richard V. Westerhoff

[57] ABSTRACT

Multi-element high energy particle detector modules comprise a planar heavy metal carrier of tungsten alloy with planar detector units uniformly distributed over one planar surface. The detector units are secured to the heavy metal carrier by electrically conductive adhesive so that the carrier serves as a common ground. The other surface of each planar detector unit is electrically connected to a feedthrough electrical terminal extending through the carrier for front or rear readout. The feedthrough electrical terminals comprise sockets at one face of the carrier and mating pins porjecting from the other face, so that any number of modules may be plugged together to create a stack of modules of any desired number of radiation lengths. The detector units each comprise four, preferably rectangular, p-i-n diode chips arranged around the associated feedthrough terminal to form a square detector unit providing at least 90% detector element coverage of the carrier. Integral spacers projecting from the carriers extend at least partially along the boundaries between detector units to space the p-i-n diode chips from adjacent carriers in a stack. The spacers along the perimeters of the modules are one-half the width of the interior spacers so that when stacks of modules are arranged side by side to form a large array of any size or shape, distribution of the detector units is uniform over the entire array.

22 Claims, 3 Drawing Sheets

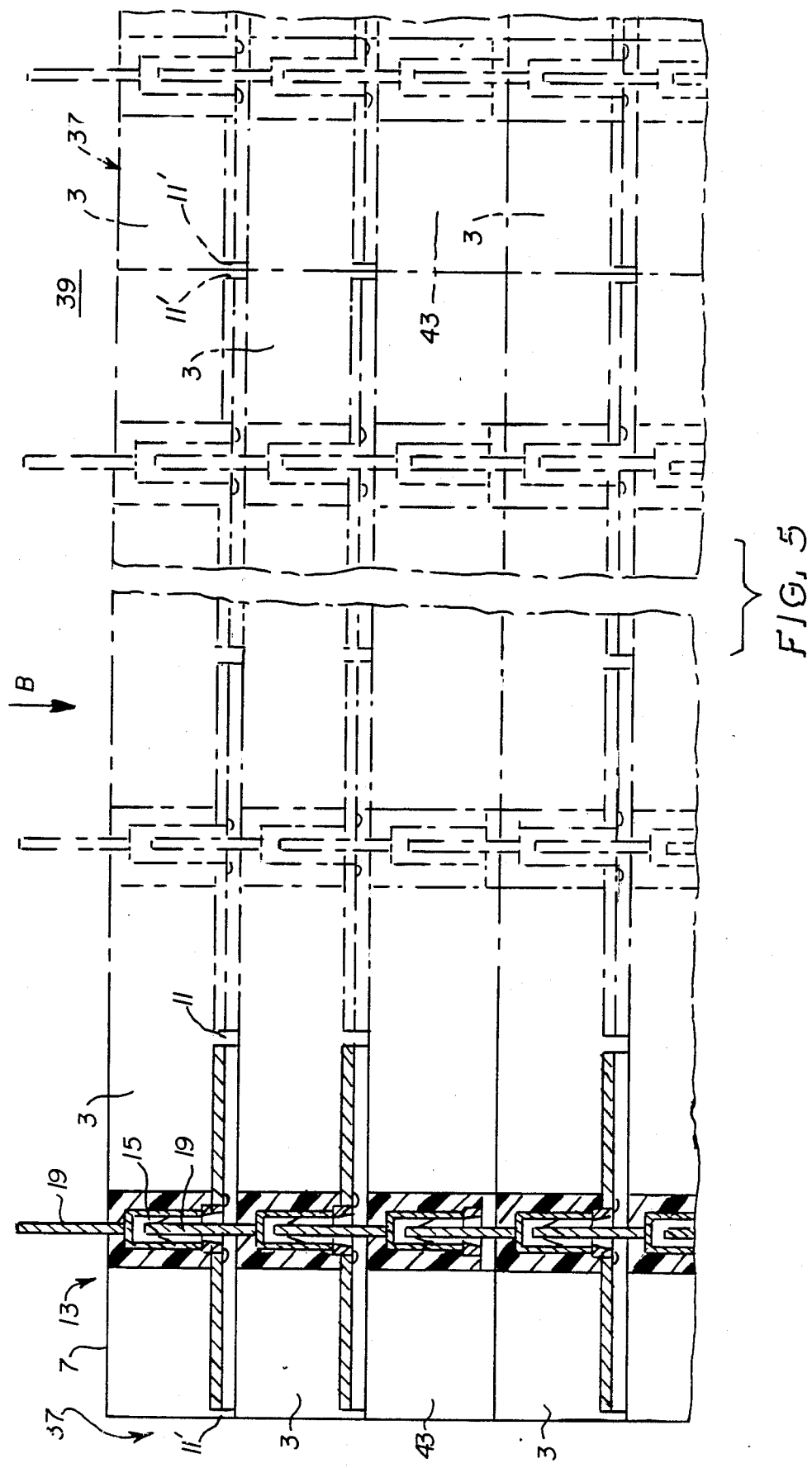

MODULAR MULTI-ELEMENT HIGH ENERGY PARTICLE DETECTOR

The United States Government has a paid-up license in this invention and the right in limited circumstances to require the patent owner to license others on reasonable terms as provided for by the terms of Contract No. DE-AC01-84ER80118 awarded by the Department of Energy.

BACKGROUND OF INVENTION

1. Field of Invention

This invention relates to high energy particle detectors and more particularly to modular high energy particle detectors which may be arranged to form large detector arrays with a uniform pattern of detector elements and which may be conveniently connected one behind the other to form stacks of detector arrays. The invention further relates to means for reading out signals generated in the separate detector elements while maximizing the total area of the array covered by detector elements.

2. Background Information

A class of detectors for the detection of charged high energy particles in the silicon calorimeter. These calorimeters are essentially passive devices in which high energy particles, normally having energies greater than one billion electron volts, impinge upon a stack of metallic plates. Each incident particle causes particles within the plates to "shower" out. The stack of plates is thick enough to contain a fully developed shower. Silicon based detector elements then detect the showering particles and provide a signal to measuring equipment which is approximately proportional to the incident particle energy. By providing an x-y array of outputs, the approximate coordinates of the incident particle as well as its energy can be determined.

A strong trend in semiconductor device technology has been toward integrating many devices and circuits on the same chip. These techniques have been applied to silicon calorimeters as discussed in Nuclear Instruments and Methods in Physics Research A238(1985) 53–60, North-Holland Amsterdam, where a 38 $cm^2$ silicon/lead sandwich calorimeter is described, and in the same publication at A251(1986) 275–285 where a 64 $cm^2$ silicon/tungsten sandwich calorimeter is detailed. These calorimeters utilize circular detector wafers with a checkerboard array of electrode strips to provide the coordinates of particle incidence. These devices have edge terminal strips which together with the circular configuration of the wafer would create large dead spaces if similar units were placed side by side to construct a larger array.

Another limitation of such large detectors with multiple detector cells integrated on a single semiconductor wafer is the cost of such devices. One factor in the cost of such a device is that a defect in any portion of the wafer requires replacement of the entire unit. In addition, it is a major task to change the geometry of such a detector.

SUMMARY OF THE INVENTION

It is an object of the present invention to provide a large array of high energy particle detectors without sizable dead spots.

It is another object to the invention to provide such a large array of high energy particle detectors at a reasonable cost.

It is an additional object of the invention to provide such an array of high energy particle detectors made up of modules which may be easily arranged to construct any desired size of detector array.

It is still another object of the invention to provide such modules which do not require edge terminal strips.

It is yet another object of the invention to provide such modules with detector units made up of low cost commonly available detector elements which may be individually removed and replaced as needed.

It is also an object of the invention to provide such modules which can be easily and quickly assembled into a stack without any special tools.

It is a further an object of the invention to provide such modules in which the heavy metal plates serve as an electrical conductor for the detector units.

These and other objects are satisfied by the invention which is directed to multi-element high energy particle detector modules and arrays constructed from such modules. Each module includes: a planar heavy metal carrier, a plurality of planar particle detector units having one face secured to one planar surface of the carrier by electrically conducting means, an electrical terminal associated with each detector unit which extends through the carrier and is electrically isolated therefrom, and electrical connector means which electrically connect the other face of the planar particle detector units to the terminal. The electrical terminals comprise a socket at one planar face of the carrier, preferably the face on which the detector elements are secured, and a pin extending from the other face of the carrier which engages the socket in an adjacent module to form a stack of modules with aligned detector elements connected in parallel.

With this arrangement, the heavy metal carrier serves as one electrical conductor for the detector units and the electrical terminals extending through the carriers serve as the second conductor, so that no terminal strips are required along the side edges of the modules. Thus, the modules can be placed side by side to form a larger array of detector units without creating dead space between modules. To facilitate this, the planar carries are regular polygons which abot one another to form a continuous uniform array of detector elements, and the detector elements are regular polygons arranged on the carrier such that at least about 90% of the surface of the carrier is covered. The detector elements are each composed of a plurality of planar polygonal shaped p-i-n diode chips arranged in radial symmetry about the associated electrical terminal.

Preferably, the planar carriers are right parallelograms, either rectangles or squares, and the detector units are also right parallelograms. In accordance with the best mode of the invention, the detector units comprise four rectangular p-i-n diode chips arranged around the associated electrical terminal to form a square.

Spacers projecting from at least one planar surface of the carriers space adjacent carriers to prevent contact between the detector units on one carrier and the adjacent carrier. Preferably, the spacers are integrally formed on the carriers, and extend at least partially along the boundaries between the detector units. The width of the spacers around the periphery of the detector array on a module are one-half the thickness of the other spacers so that the spacing between detector units in an array formed by arranging modules side by side is uniform across the array. The preferred heavy metal carriers are machined from a tungsten alloy consisting of at least 90% tungsten to form the integral spacers.

BRIEF DESCRIPTION OF THE DRAWINGS

A full understanding of the invention can be gained from the following description of the preferred embodiment when read in conjunction with the accompanying drawings in which:

FIG. 5 is a section through an array of side by side stacks of the modules of FIG. 1 and including scintillator plates.

DESCRIPTION OF THE PREFERRED EMBODIMENT

Figure 1:
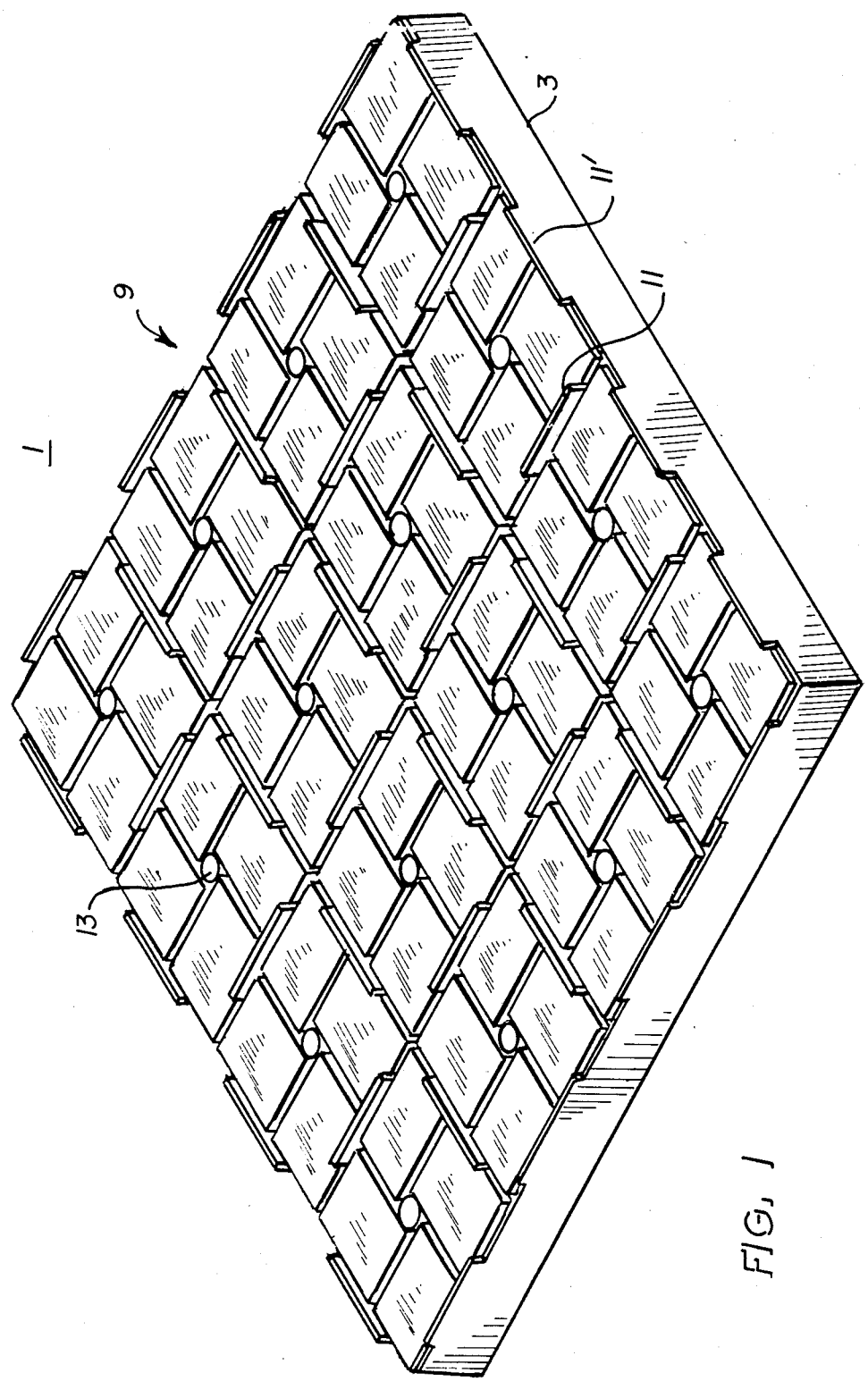
FIG. 1 is an isometric view of a high energy particle detector module in accordance with the invention.
Figure 2:
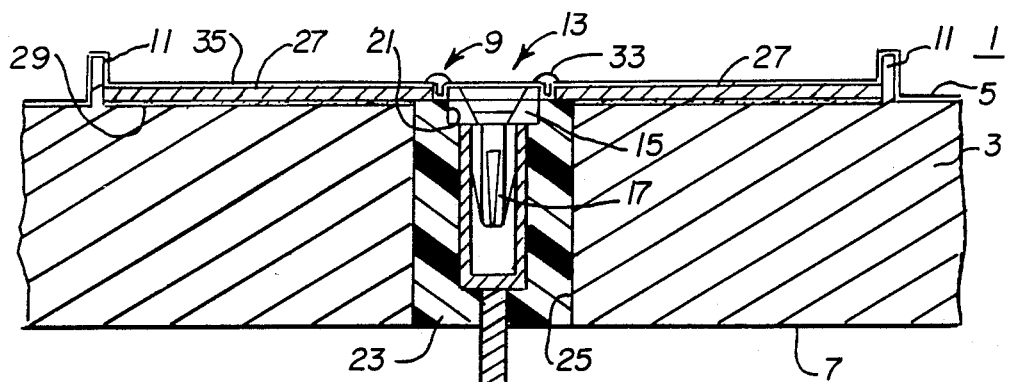
FIG. 2 is a vertical section through a portion of the module of FIG. 1.

As shown in FIGS. 1 and 2, the high energy particle detector module 1 in accordance with invention includes a planar carrier 3 having a first planar surface 5 and a second planar surface 7. A number of square particle detector units 9 are uniformly distributed across the first planar surface 5. Integral spacers 11 projecting perpendicularly from the first surface of the carrier 3 extend at least partially along the boundaries between detector units 9. The spacers 11' along the perimeter of the carrier are only one-half as wide as the other spacers, so that as will be seen, when two or more modules 1 are placed side by side to form an array, the spacing between detector units across the array remains uniform.

In the exemplary embodiment of the invention, a tungsten alloy is used as the heavy metal for the carrier 3. While tungsten and uranium are the most commonly used heavy metals employed in calorimeters, uranium has fire and health safety risks associated with it and elemental tungsten in brittle except in highly purified form (which is not necessary for calorimeter applications). Tungsten alloys are relatively safe and are also much more machineable. The latter is important because the integral spacers 11 formed in the carriers 3 are very thin.

Tungsten alloys with about 90% tungsten are suitable. We used Kenneritum W-5, a tungsten alloy available from Kennametal Company of Latrobe, Pa. This alloy has density of 18.0 g/cm$^3$, a Moliere radius of 0.97 cm (estimated) and a radiation length of 0.42 cm (estimated). Plates of the tungsten alloy are milled to form the integral spacers 11 which are only 0.010 inches (0.0254 mm) wide and the perimeter spacers 11' which are only 0.005 inches (0.0127 mm) wide.

Associated with each detector unit 9 is a feedthrough electrical terminal 13 which extends all the way through the carrier 3. The feedthrough electrical terminals 13 are gold-plated, precision-machined assemblies including tapered sockets 15 with beryllium-copper fingers 17 and pins 19, which as will be seen, are sized to engage a socket in an electrical terminal 13 in an adjacent module 1. Each electrical terminal 13 is mounted in a counterbored aperture 21 through a sleeve 23 which in turn is mounted in a bore 25 through the carrier 3.

The sleeve 23, which is made of a suitable insulating material, electrically isolates the electrical terminal 13 from the carrier 3.

The detector units 9 are composed of a number of discrete silicon p-i-n diode chips 27. Such chips, which are readily available commercially, have metalized areas on the two planar surfaces which serve as terminals for the device. Other semiconductor detector devices could be utilized, however, the availability of the silicon p-i-n diode chips makes them the most economical.

A number of factors go into the selection of the number and configuration of the p-i-n diode chips 27 in each detector unit 9. The most important factor is to provide as much coverage of the carrier 3 with the detector material as possible. However, other important considerations are symmetry and regularity. Additional constraining factors related to the design of the detector unit 9, are the placement of the spacers 11 and restriction of their wall thickness or width. An additional issue to consider is the size of a single detector chip. Because it is desirable that these detector chips be relatively inexpensive and utilize widely available devices, certain geometries are favored.

Design at the detector unit level can be viewed as a tiling problem. It is desirable to create a detector unit 9 with a small number of detectors (in order to keep resolution relatively high), with uniformity in both the x and y axes (for lattice regularity), and with space for the feedthrough electrical terminals 13 (for data acquisition), while maintaining a high percentage of detector coverage over the cell. It is also easier to cut the chips 27 into configurations having straight sides such as polygons. Right parallelograms, i.e. squares or rectangles, are favored because they can be produced by dicing.

Figure 3:
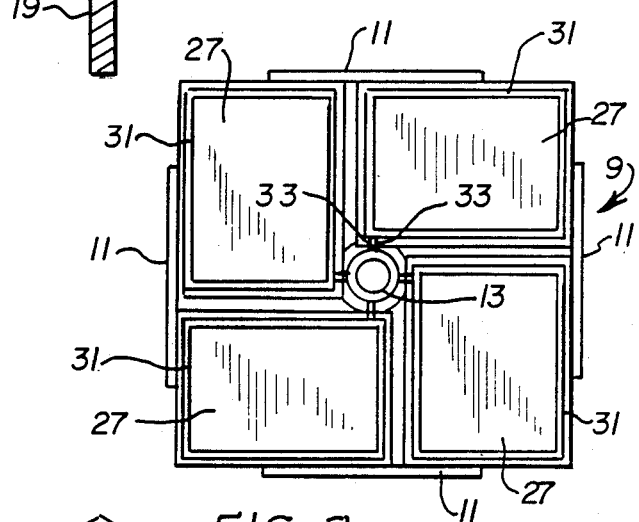
FIG. 3 is a plan view of enlarged scale of a particle detector unit on the module of FIG. 1.

We have found that the detector unit 9 shown in FIG. 3 achieves the best results. In this arrangement, four rectangular planar p-i-n diode chips 27 are arranged around the associated feedthrough electrical terminal 13 to form a square detector unit 9. There is four fold symmetry associated with this detector unit, with rotational but not reflection symmetry about these axes. This design permits the close surrounding of small centrally placed feedthrough electrical terminals 13 by the four rectangular p-i-n diode chips 27. Square chips would not be suitable in terms of the simultaneous requirements of high coverage and allowance for uniformly distributed feedthrough electrical terminals.

The p-i-n diode chips 27 are secured to the carrier by an electrically conductive attachment means 29, which in addition to physically securing the diode in place on the carrier, electrically connects one terminal of the diode to the carrier 3 which serves as a common ground for all of the chips. Various means may be used for this purpose. The preferred adhesive is an electrically conductive tape which in the exemplary module is only 0.112 inches (0.05 mm) thick and composed of suspended silver-coated nickel particles. The ease of application and removal of this tape makes it practical to test the chips after mounting and to easily remove and replace defective chips. The tape, which has adhesive on both surfaces, is cut into appropriately sized pieces and attached to the carrier 3.

Alternative means of securing the chips to the carrier, include a conducting epoxy, typically silver filled, which provides a firm bond, but is at a disadvantage in terms of replacing chips on the carrier. In addition, filled epoxy is a relatively rough-grit substance, requiring taller spacer walls to insure electrical isolation between components. Such an arrangement would be less structurally sound than a design with a thinner adhesive and, thus shorter spacer walls.

Indium alloy solder provides good conductivity but it requires heating. Generally, heating of the chip carrier 3 through placement of one chip is disadvantageous because all the chips would tend to be loosened. Even at relatively low temperatures, thermal expansion can also cause problems.

Silver print, like the preferred conducting tape, provides sufficient adhesion to maintain the chips in there appropriate positions, but not so much adhesive strength as to cause difficulty for removal and replacement of the chips.

After the chips 27 have been mounted on the carrier 3, the aluminum terminal on the top side of each chip must be connected to the associated feedthrough electrical terminal 13. This is accomplished using a wire bonding machine. Aluminum wire, 0.001 inches (0.025 mm) thick is used to make the connection between a thin aluminum terminal 31 around the edge of the diode chip 27 and the rim of the feedthrough electric terminal 13. To assure reliable performance, two wires 33 are placed between each chip 27 and the feedthrough electrical terminal 13. Thus, it can be seen that the four chips 27 are electrically connected in parallel to form a single basic detector unit 9.

Testing has shown that the performance of the chip 27 can, under certain conditions, degrade over time. This degradation includes increased leakage current and unstable operations. It appears that such degradation is caused by exposure of bare silicon to the environment. In order to prevent this problem, an acrylic sealant 35 is applied to the chips 27 after mounting and wire bonding.

In the exemplary detector module 1, 16 square detector units 9 are mounted on a square carrier 3. With one terminal of each of the detector chips 27 making up each of the detector units 9 electrically connected to the carrier which forms one electrical conductor, and with the other terminal of each of the detector chips 27 connected to the associated feedthrough electrical connector 13, no edge connectors are required and the signals generated by the detector units 9 can be accessed from either the front or the back of the carrier.

Figure 4:
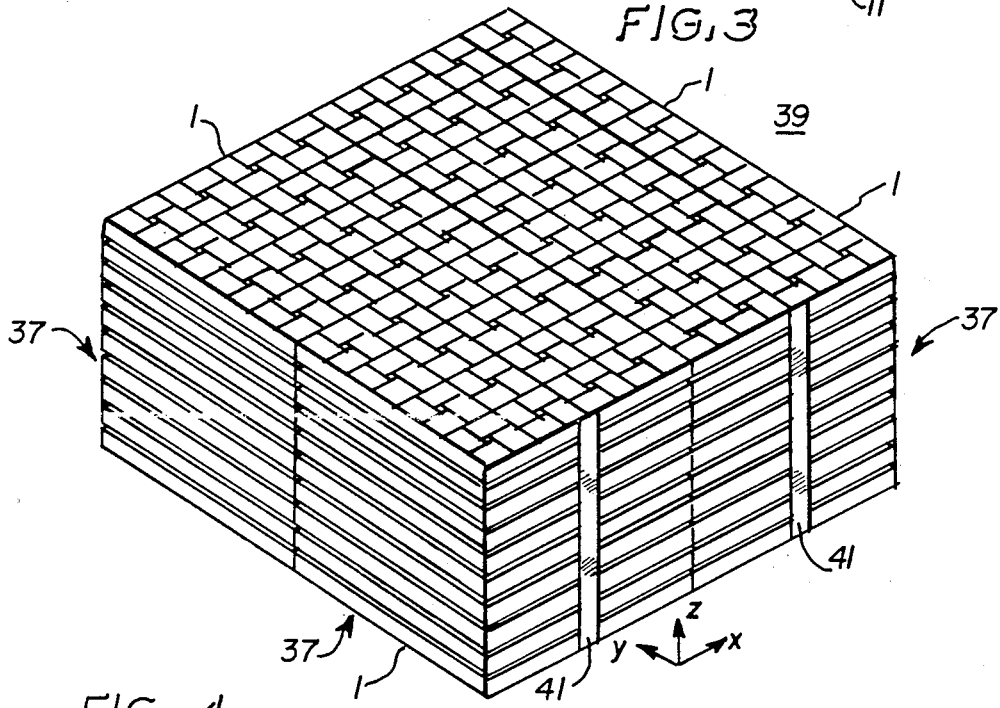
FIG. 4 is a calorimeter construed from a number of the modules of FIG. 1.

Any number of the detector modules 1 can be mated with the pins 19 of the electrical connectors 13 on each carrier engaging the sockets 15 in the adjacent module to form a stack 37 of modules as shown in FIG. 5. The engagement of the sockets and pins in adjacent modules not only provides an electrical feedthrough but also mechanically interconnects the modules. Any number of stacks 37 of modules 1 can be placed side by side like building blocks to form an arbitrarily large two-dimensional array 39 of module stacks as shown in FIGS. 4 and 5.

The array 39 of stacks 37 of modules can be regarded as a superlattice although it is intended to simply extend the size of the x-y array on individual carriers 3 without introducing any break in regularity. In this regard, it can be seen from FIG. 5 that the spacers 11' along the perimeters of adjacent modules one-half the width of the interior spacers 11, the spacing between detector units 9 across the entire array is uniform.

The arbitrary depth in the z-direction, the direction of a particle beam B shown in FIG. 5, permits an arbitrary number of radiation lengths to be placed in the beam path. The depth can be changed at any time by mating or unmating modules 1 in each stack 37. The arbitrary number of stacks 37 permits an arbitrarily shaped area to be covered. The area can be changed at any time by adding or removing stacks 37.

While all of the carriers 3 are at ground potential and are in contact with each other through the spacers 11, it is advisable to provide a conductive tape 41 along the side of the stack to assure that all of the carriers are at the same potential. Such tape being adhesive on both sides also provides a positive electrical connection between the carriers 3 in the various stacks 37 making up an array of stacks 39. Other means for interconnecting the carriers could also be used, however, the conductive tape is inexpensive, easily applied and removed to accommodate changes in the calorimeter configuration, and very importantly, has negligible effect on the silicon covered area of the carriers of the symmetry of the array.

By avoiding busing down the sides of the modules and dead space at the edge of the modules, the array of modules extends the array of chips without a break in the periodicity of the detector array 39. That is, the design preserves translation invariance in the x-y plane. Dead space or some other appreciable, distinguishing feature at the edges of a module would result in a module array superlattice with the new structure having the periodicity of the superlattice. Stacking of the modules 1 in the z direction builds up a three dimensional structure with the three dimensional translation invariance of a Bravais lattice.

The modularity of the high energy particle detector of the invention also permits some degree of segmentation in the z-direction. For example, it is easy to break the interconnections between the front and back portions of each stack 37 of modules 1 in order to permit separate front-back readout. This would provide a means for probing shower development.

It is also possible to introduce special purpose planes of any sort into a stack 37 of modules 1, as long as the inserts are pin compatible. Pin compatibility can be achieved by utilizing the same feedthrough electrical connectors 13 and mounting them in arrays machined by the same programmed pattern as used in the fabrication of the carriers 3. An example of the insert concept is shown in FIG. 5 in which polyvinyltoluene base plastic scintillators (NE 104) having the same area of the tungsten alloy carriers 3 is mounted in the stack 37 using the feedthrough electrical connectors 13. This can be useful because the p-i-n diodes 27 employed can act as photodetectors.

In the exemplary detector modules, the carriers 3 are 2.5 inches × 2.5 inches by 0.215 inches (6.35 mm × 6.35 mm × 0.55 mm) before milling. One face of the carrier was milled to a depth of 0.35 inches (0.89 mm) to form the spacers 11 of that height. The chips 27 are nominally 0.2675 inches by 0.3475 inches (6.79 mm × 8.83 mm) which leaves an area of 0.006 square inches (4.12 sq. mm) for the feedthrough electrical connectors 13. With the spacers 0.010 inches (0.254 mm) wide in the center and one-half that width around the perimeter, and considering a tolerance of 0.005 inches (0.127 mm) for the dimensions of the chips 27, the fill factor for the resulting 0.625 × 0.625 inch (1.59 cm × ×1.59 cm) detector cell 9 is 92%. Significant reduction of the percentage associated with the feedthrough electrical connectors 13 appears difficult. Using the same size feedthrough electrical connectors with larger detector units 9 would obviously increase the percentage of silicon coverage. For example with 2 cm×2 cm (0.787 inch×0.787 inch) detector units 9 the fill factor is a calculated 95.8%.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A high energy particle detector module comprising;
    a planar heavy metal carrier having first and second planar surfaces;
    a plurality of planar particle detector units substantially evenly distributed across the first planar surface of said carrier;
    electrically conductive attachment means securing one face of each planar particle detector unit to said first planar surface of said carrier;
    an electrical terminal associated with each planar particle detector unit extending through said carrier from said first planar surface to said second planar surface;
    means electrically insulating the terminals from said carrier; and
    connecting means electrically connecting the other face of each planar particle detector unit to the associated terminal at the first planar surface.

2. The module of claim 1 wherein said carrier is a regular polygon and said planar particle detector units are regular polygons arranged on the first planar surface of the carrier such that at least about 90% of said first planar surface is covered by said detector units.

3. The module of claim 2 wherein said planar particle detector units each comprise a plurality of polygonal planar p-i-n diode chips arranged in radial symmetry about the associated electrical terminal.

4. The module of claim 2 wherein said carrier is a right parallelogram and wherein said detector units are right parallelograms.

5. The module of claim 4 wherein said detector units each comprise a plurality of rectangular planar p-i-n diode chips.

6. The module of claim 5 wherein said detector units each comprise four rectangular planar p-i-n diode chips arranged around the associated electrical terminal to form a square detector unit.

7. The module of claim 1 wherein said carrier comprises a tungsten alloy with at least about 90% tungsten.

8. A high energy particle detector comprising at least two detector modules, each module comprising:
    a planar heavy metal carrier having first and second planar surfaces;
    a plurality of planar particle detector units substantially evenly distributed across the first planar surface of said carrier;
    electrically conductive attachment means securing one face of each planar particle detector unit to said first planar surface of said carrier;
    an electrical terminal associated with each planar particle detector unit extending through said carrier from said first planar surface to said second planar surface;
    means electrically insulating the terminals from said carrier; and
    connecting means electrically connecting the other face of each planar particle detector unit to the associated terminal at the first planar surface.

9. The detector of claim 8 wherein the electrical terminals each comprise: a socket at one planar surface of the carrier and a pin extending from the other surface of the carrier, said pins on the electrical terminals of one module engaging the sockets in the electrical terminals of an adjacent module to form a stack of modules with aligned detector units connected in parallel.

10. The detector of claim 9 including a planar non-electrically conducting plate substantially the same size as the carriers and having electrical feed through connectors which, with said non-electrically conducting plate inserted in a stack of modules, are aligned with said electrical terminals in said carriers, said feed through connectors having a socket at one face which receives the pin from one adjacent module and a pin at the other face which is received in the socket of the electrical terminal in the other adjacent module to electrically connect aligned detector units in the two adjacent modules.

11. The detector of claim 9 including spacers extending generally perpendicularly outward from the first surface of each carrier farther than the thickness of the planar detector units such that the detector units are spaced from the second planar surface of an adjacent carrier in a stack of modules.

12. The detector of claim 11 wherein said spacers are integrally formed with said carrier.

13. The detector of claim 12 wherein said carriers with the integral spacers are made of a tungsten alloy comprising at least 90% tungsten.

14. The detector of claim 11 wherein said one planar surface of a carrier at which said sockets of the electrical connectors are located is the first planar surface and wherein said pin of each electrical terminal extends from the second planar surface of each carrier a distance sufficient to engage the socket in an electrical terminal in an adjacent module spaced from said second planar surface by said spacers.

15. The detector of claim 11 wherein said spacers are integrally formed with said carrier.

16. The detector of claim 15 wherein said spacers extend at least partially along boundaries between at least some adjacent detector units.

17. The detector of claim 8 wherein said carriers are regular polygons arrangeable side by side to form a continuous array of substantially evenly distributed particle detector units.

18. The detector of claim 17 wherein said particle detector units cover at least 90% of said array.

19. The detector of claim 18 including spacers projecting generally perpendicularly outward from the first surface of each carrier at least as far as the thickness of the planar detector unit and extending at least partially along boundaries between at least some adjacent detector units, with spacers along the periphery of the carriers being one half as wide as spacers between adjacent detector units on a carrier, such that with carriers arranged side by side to form said array, the spacing between detector units across the array is uniform.

20. An array of multi-element high energy particle detector modules comprising:

a plurality of planar right parallelogram carriers of heavy metal having first and second planar surfaces;

a plurality of right parallelogram planar p-i-n diode detector elements substantially uniformly distributed across the first planar surface of each carrier;

electrically conductive attachment means securing one face of each planar p-i-n diode detector element to said first planar surfaces of said carriers;

an electrical terminal associated with each planar p-i-n diode detector element extending through said carrier and having a socket at one planar surface of the carrier and a pin extending from the other planar surface of the carrier;

means electrically insulating the terminals from said carriers, and connecting means electrically connecting the other face of each planar p-i-n diode detector element to the associated terminal;

at least some of said right parallelogram carriers being arranged side by side to form planar arrays of substantially uniformly distributed detector elements, and said planar arrays being stacked in layers with the pins extending from one planar surface of the carriers in at least some of said planar arrays engaging the sockets in the other planar surface of carriers in an adjacent array.

21. The array of claim 20 including integral spacers extending at least partially along at least some boundaries between p-i-n diode detector elements on the first planar surface of said carriers and projecting substantially perpendicularly from the first planar surface of the carrier a distance sufficient to bear against the second planar surface of a carrier in an adjacent layer.

22. The array of claim 20 wherein each right parallelogram p-i-n diode detector element comprises four planar rectangular p-i-n diode chips arranged around the associated electrical terminal to form a square detector element.

* * * * *